(12) United States Patent
Chung

(10) Patent No.: US 6,663,394 B1
(45) Date of Patent: Dec. 16, 2003

(54) RIVET ATTACHMENT ASSEMBLY FOR SECURING ADAPTER CARD

(75) Inventor: Cheng-Kuang Chung, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/318,946

(22) Filed: Dec. 12, 2002

(30) Foreign Application Priority Data

Oct. 11, 2002 (TW) ...................................... 91216191 U

(51) Int. Cl.[7] ................................................. H01R 13/73
(52) U.S. Cl. ........................ 437/564; 439/377; 411/522; 411/546
(58) Field of Search ................................ 439/564, 565, 439/65; 411/517–519, 377, 521, 522, 535–537, 546

(56) References Cited

U.S. PATENT DOCUMENTS

| | | | | |
|---|---|---|---|---|
| 3,851,222 A | * | 11/1974 | Michalak et al. ........... 361/757 |
| 4,050,771 A | * | 9/1977 | Watson et al. .............. 439/736 |
| 4,587,377 A | * | 5/1986 | Rodseth ..................... 174/16.3 |
| 4,693,529 A | * | 9/1987 | Stillie .......................... 439/67 |
| 4,830,557 A | * | 5/1989 | Harris et al. ................ 411/113 |
| 5,157,749 A | * | 10/1992 | Briggs et al. ................. 385/60 |
| 6,169,412 B1 | * | 1/2001 | Byers ......................... 324/758 |
| 6,176,666 B1 | * | 1/2001 | Osterlund ................... 411/535 |

* cited by examiner

Primary Examiner—Tho D. Ta
Assistant Examiner—James R. Harvey
(74) Attorney, Agent, or Firm—Wei Te Chung

(57) ABSTRACT

A rivet attachment assembly of the present invention includes a tongue element (22) having an opening (221) therein, a rivet member (23) having a through hole defined therein and a screw (30). The rivet member is in loose engagement with the tongue element, and the screw goes through a mounting hole (41) of an adapter card (40) and the through hole of the rivet member to secure an adapter card to the rivet member. The rivet member is movable in the opening of the tongue element to allow alignment of the mounting hole of the adapter card with the through hole of the rivet member thereby allowing the rivet attachment assembly to secure the adapter card in the electronic device.

2 Claims, 5 Drawing Sheets

RIVET ATTACHMENT ASSEMBLY FOR SECURING ADAPTER CARD

BACKGROUND OF THE INVENTION

1. Field of the Invention

The present invention relates to an attachment assembly for securing accessories in an electronic device, such as a computer, a server, or a Network Attached Storage (NAS) device, and particularly to a rivet attachment assembly for securing an adapter card to a housing of an electronic device.

2. Related Art

With the development of information technology, computers and Internet services are widely used in the world. To provide all kinds of functions and services, many adapter cards, such as sound cards or Local Area Network (LAN) cards, are used in computers or servers. A computer generally comprises at least one housing and a motherboard received therein. The motherboard has at least one slot for mounting an adapter card. It is necessary to secure the adapter card to the housing after the adapter card has been inserted into the slot. A conventional attachment assembly used in a computer for securing an adapter card to the housing is shown in FIG. 6. The computer comprises a housing 10. A tab 12 extends inwardly from a sidewall 11 of the housing 10. An opening 13 just big enough to accommodate a screw 15 is formed in the tab 12. An adapter card 14 has an opening 16. The screw 15 passes through both the opening 16 of the adapter card 14 and the opening 13 of the tab 12 to secure the adapter card 14 to the housing 10.

However, since adapter cards are produced by different manufacturers, hole mismatches are difficult to avoid. So misalignment between the opening in the adapter card and the opening in the tab of the housing may prevent the adapter card from being secured to the housing. An adapter card without further attachment to the housing is susceptible to disengagement from the slot as a result of unexpected mechanical impacts and the like.

Accordingly, an improved attachment assembly for securing an adapter card to a housing is desired.

SUMMARY OF THE INVENTION

An object of the present invention is to provide an improved attachment assembly which can compensate for mismatches in hole positions between an adapter card and a housing to which the adapter card is to be secured.

To achieve the above object, an attachment assembly of the present invention comprises a tongue element having an opening therein, a rivet member, and a screw. The rivet member is in loose engagement with the tongue element and the screw is used to secure an adapter card to the rivet member. The rivet member can move in the opening of the tongue element, allowing alignment of a through hole of the rivet member with a mounting hole of the adapter card. Therefore, the rivet attachment assembly can readily secure the adapter card in the electronic device, even if slight misalignment errors are made in placement of the mounting hole in the adapter card.

These and additional objects, features and advantages of the present invention will become more apparent after reading the following detailed description of a preferred embodiment of the invention taken in conjunction with the appended drawings, in which:

DETAILED DESCRIPTION OF THE INVENTION

Figure 1:
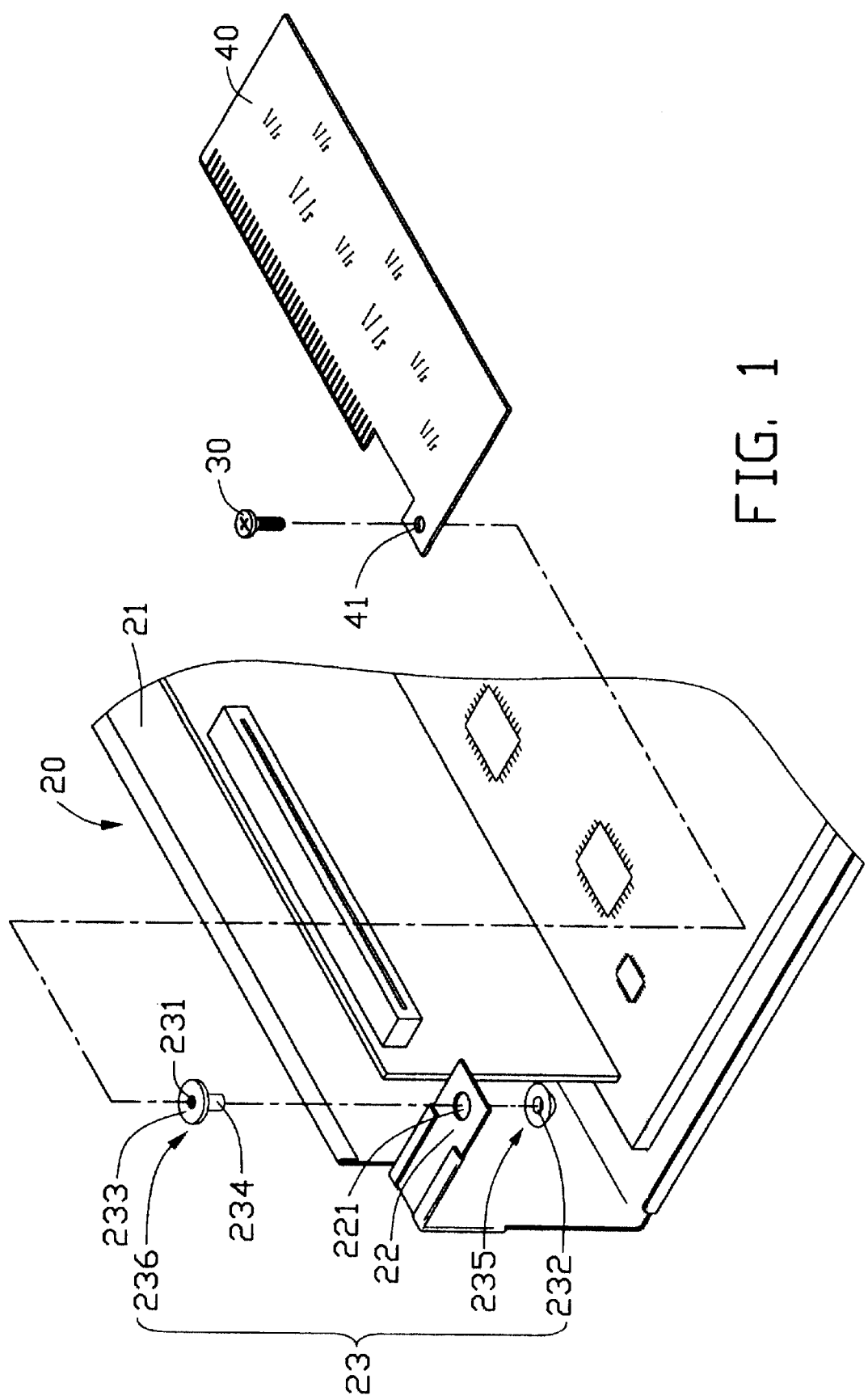
FIG. 1 is an exploded view of a rivet attachment assembly according to the present invention shown with a partial interior of an electronic device and an adapter card.

Referring to FIG. 1, a rivet attachment assembly according to the present invention for securing an adapter card 40 in an electronic device 20 comprises a tongue element 22, a rivet member 23, and a screw 30.

The electronic device 20 includes a housing 21 and is shown with a motherboard (not labeled) and a daughter board (not labeled). The adapter card 40 is shown attaching to the daughter board. The housing 21 comprises a sidewall (not labeled) which forms the tongue element 22 extending inwardly from the sidewall. The tongue element 22 can be integrally formed with the housing 21 of the electronic device 20. The tongue element 22 is rectangular and has a relatively large, circular opening 221 defined therethrough.

Figure 4:
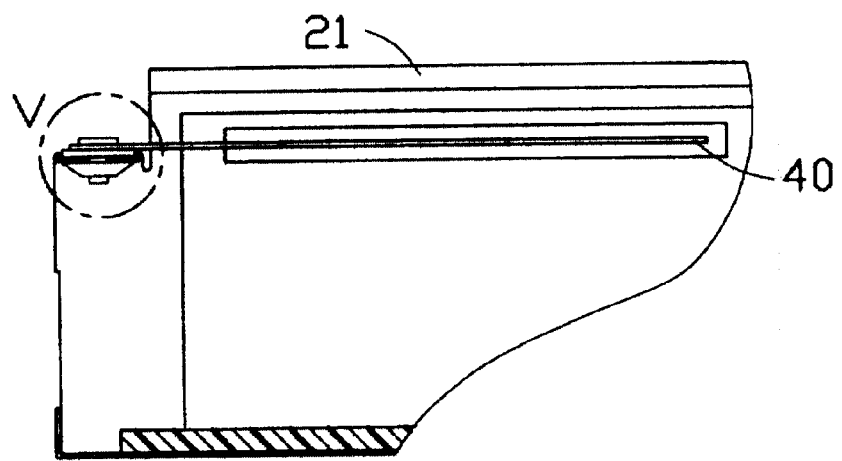
FIG. 4 is a frontal, cross-sectional view of FIG. 2.

The rivet member 23 comprises a cap 236 and a base 235. The cap 236 and the base 235 can be made of metal or plastic materials. The cap 236 has a top portion 233 and a neck 234 connected therewith, with a through hole 231 defined through both the top portion 233 and the neck 234. The through hole 231 has threads (not shown) formed on an inside wall thereof. The top portion 233 of the cap 236 is annular and the neck 234 is in the shape of a cylinder. Referring also to FIG. 4, the base 235 has a flat, annular upper side and a conically tapered lower side with a hole 232 through the center. The diameter of the hole 232 is big enough to engage with the neck 234. The outer diameter of the base 235 is equal to the outer diameter of the top portion 233. The diameter of the circular opening 221 is smaller than the outer diameter of the top portion 233 and much bigger than the outer diameter of the neck 234.

Figure 2:
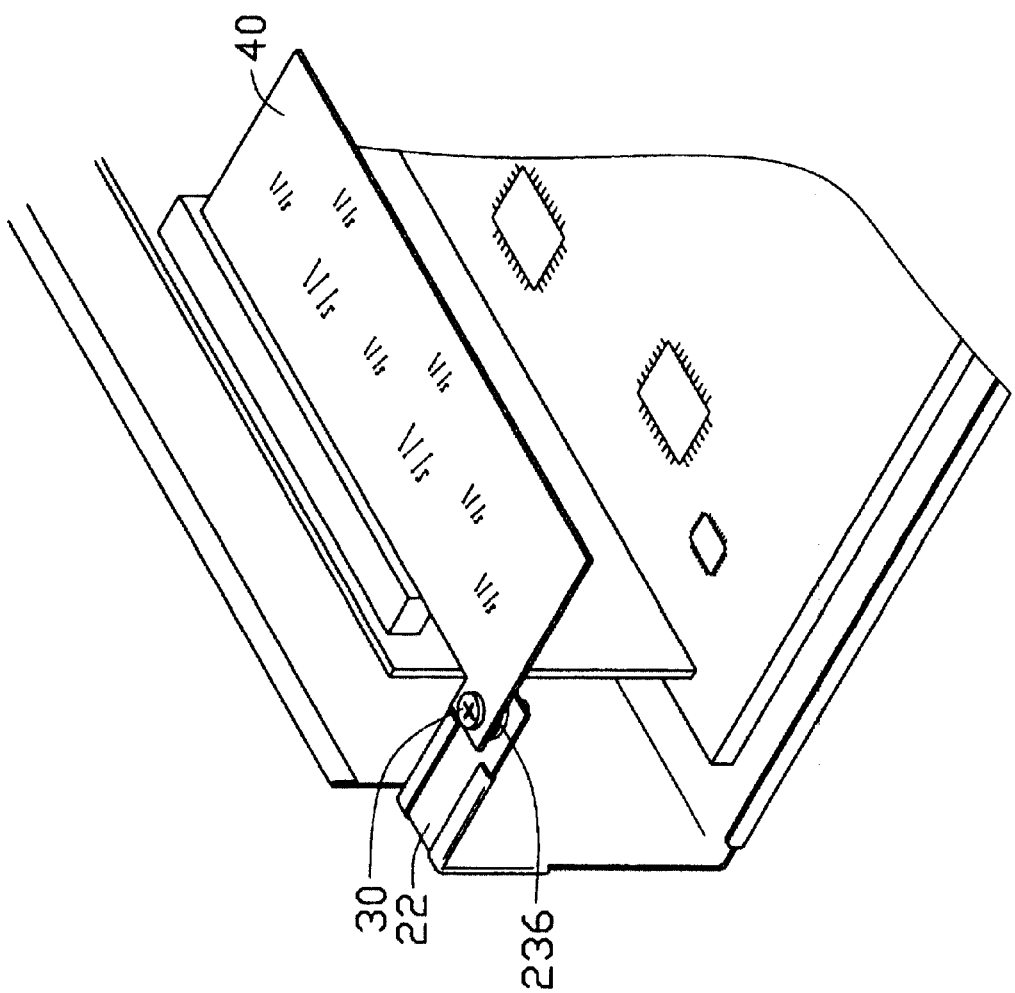
FIG. 2 is an assembled view of FIG. 1.
Figure 3:
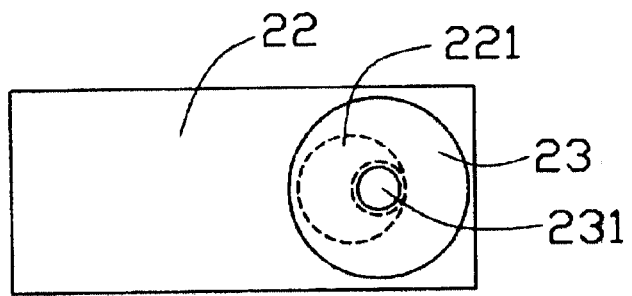
FIG. 3 is a detail of FIG. 2 showing the fit of a rivet member assembled with a tongue element of the rivet attachment assembly.
Figure 5:
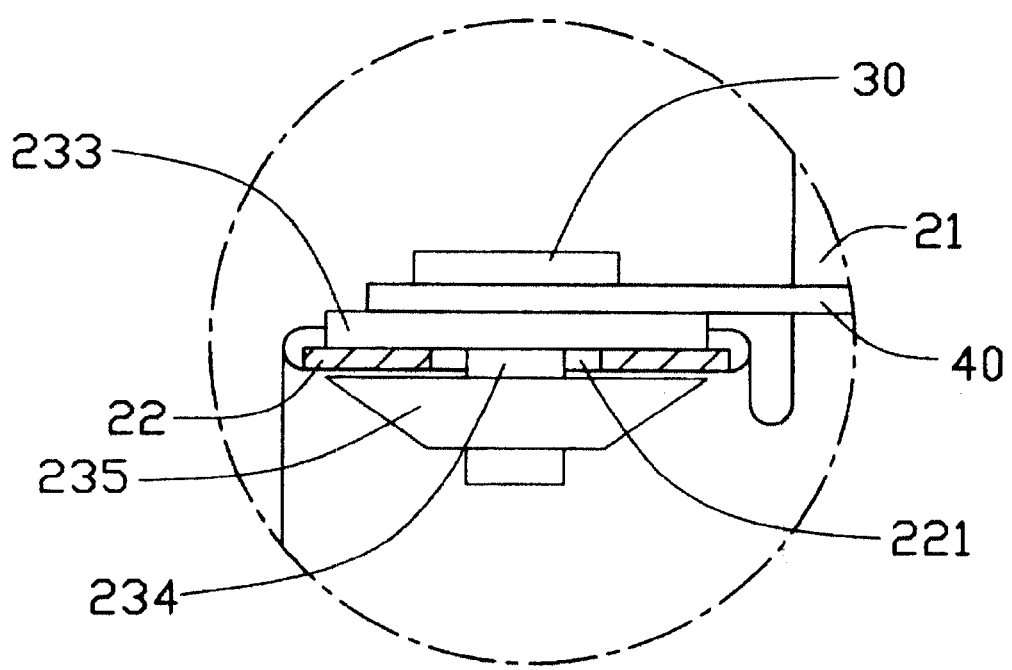
FIG. 5 is an enlarged detail of an area within circular line V of FIG. 4, showing the rivet attachment assembly, with the tongue element shown in cross section.
Figure 6:
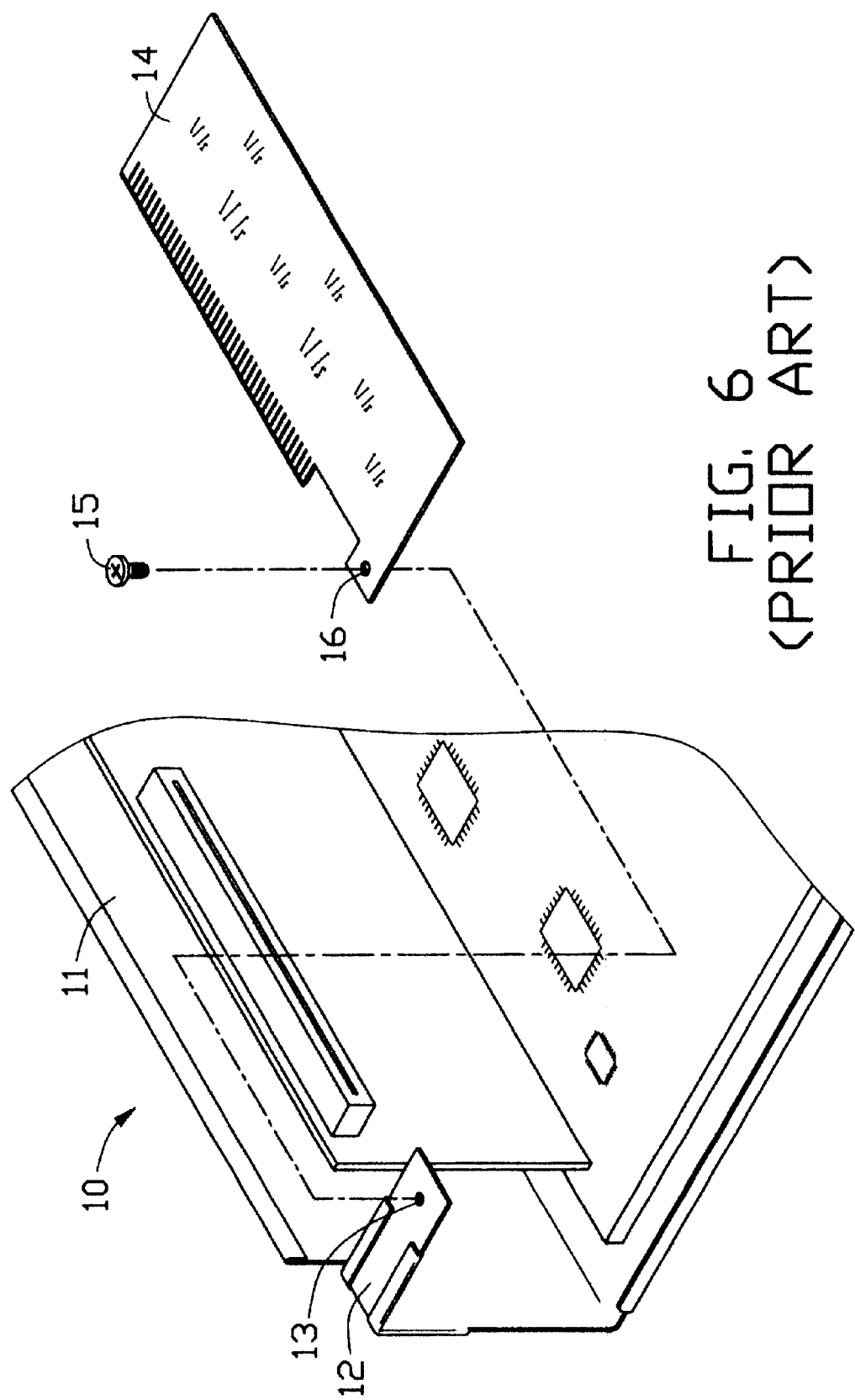
FIG. 6 is an exploded view of an attachment assembly of the prior art, shown with a partial interior of an electronic device.

Referring to FIGS. 2, 4 and 5, the rivet attachment assembly may be assembled as follows. First, the cap 236 is disposed on the tongue element 22 with the neck 234 inserting into the circular opening 221 and the top portion 233 pressing against a top surface of the tongue element 22. Then, the neck 234 is pressed into the hole 232 of the base 235 and engaged therewith. The cap 236 is then in a position above the tongue element 22 and the base 235 is below the tongue element 22. There is a distance between the top surface (not labeled) of the base 235 and a lower surface (not labeled) of the tongue element 22, to allow movement of the rivet member 23, relative to the tongue element 22. The rivet member 23 thus movably engages with the tongue element 22 through the circular opening 221, moving within a certain space, since the diameter of the circular opening 221 is smaller than the outer diameter of the top portion 233 and much bigger than the outer diameter of the neck 234.

The attachment of the adapter card 40 to the housing 21 is as follows. First, the adapter card 40 is inserted into a slot (not labeled) of a connector 42 (not labeled) on the daughter board. Secondly, the screw 30 passes through a mounting hole 41 of the adapter card 40, and engages with the threads of the though hole 231 of the cap 236 of the rivet member 23. The insertion of the screw 30 causes the neck 234 of the cap 236 to expand outwardly, tightly engaging the neck 234 with sidewalls of the hole 232 of the base 235. If the mounting hole 41 of the adapter card 40 misaligns with the through hole 231 of the cap 236 after the adapter card 40 has been inserted into the slot of the connector (not labeled) during assembly, the rivet member 23 can move within the circular opening 221 so that the mounting hole 41 can be aligned with the through hole 231. Thus, the rivet member 23 and screw 30 can secure the adapter card 40 to the tongue element 22 in the electronic device 20. In this embodiment, a bolt (not shown) can also be substituted for the screw 30.

A rivet attachment assembly according to a second embodiment (not shown) of the present invention has a rivet member which comprises a cap (not shown) similar to the cap 236 rivet and a base in the shape of the letter "C". A circular slot is defined around a bottom of the neck of the cap to engage with the "C"-shaped base. The outer diameter of the base is bigger than the circular opening 221 of the tongue element 22.

A rivet attachment assembly according to a third embodiment (not shown) of the present invention has a rivet member comprising a base (not shown) and a screw (not shown). The screw has a vertical cross-section in the shape of the letter "T" and comprises a head and a cylindrical neck connected therewith. Both the head of the screw and the base are circular and each has a diameter bigger than the diameter of the circular opening 221 of the tongue element 22. In use, the neck of the screw is inserted through the mounting hole of the adapter card 40, through the opening 221 of the tongue element 22, and engages with a threaded hole defined through a center of the base (not shown).

The described rivet attachment assembly provides an improved means of attaching an adapter card in a housing since it can compensate for mismatches in hole positions between the adapter card and the housing. It is simple and effective, and provides a low-cost solution to a problem of the prior art.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. A rivet attachment assembly for securing an adapter card in an electronic device, comprising:

a tongue element permanently fixed to the electronic device and having an opening therein; a rivet member having a through hole defined therein; and a fastener;

wherein the rivet member is in loose engagement through the opening with the tongue element, and the rivet member is movable in the opening of the tongue element to allow alignment of a mounting hole of the adapter card with the through hole of the rivet member, and the fastener goes through both the mounting hole of the adapter card and the through hole of the rivet member to secure the adapter card to the rivet member, allowing the rivet attachment assembly to secure the adapter card in the electronic device, wherein the rivet member comprises a cap and a base;

wherein the cap of the rivet member comprises a top portion and a neck connected therewith, and the through hole is defined through both the top portion and the neck;

wherein threads are formed on an inside wall of the through hole;

wherein the base has an annular upper side and a lower side, and a hole is defined through a center of the base;

wherein the outer diameter of the base is equal to the diameter of the cap;

wherein the diameter of the opening of the tongue element is of the cap and bigger than the outer diameter of the neck;

wherein the tongue element is integrally formed with the housing of the electronic device;

wherein the opening of the tongue element is circular;

wherein the through hole of the rivet member is circular;

wherein the fastener is a screw.

2. An attachment assembly for securing an adapter card in an electronic device, comprising:

a tongue element permanently fixed to the electronic device and having an opening therein;

a fastener; and a rivet member comprising a neck and defining a through hole;

wherein a diameter of the opening of the tongue element is relatively bigger than an outer diameter of the neck, and the rivet member is in loose engagement with the tongue element with the neck passing through the opening, and the fastener goes through both a mounting hole of the adapter card and the through hole of the rivet member to secure the adapter card to the rivet member, and the rivet member is movable in the opening of the tongue element to allow alignment of the mounting hole of the adapter card with the through hole of the rivet member so that the rivet attachment assembly can secure the adapter card in the electronic device;

wherein the rivet member comprises a cap and a base;

wherein the cap of the rivet member comprises a top portion and the neck connecting therewith, and the through hole is defined through both the top portion and the neck;

wherein the base is in the shape of the letter "C", a circular slot is defined around a bottom of the neck of the cap to engage with the "C"-shaped base;

wherein the rivet member comprises a base and a screw;

wherein a threaded hole is defined through the base;

wherein the screw has a neck inserted to the threaded hole of the base.

* * * * *